(12) United States Patent
Huang et al.

(10) Patent No.: US 10,136,525 B2
(45) Date of Patent: Nov. 20, 2018

(54) DISPLAY DEVICE

(71) Applicant: BENQ Corporation, Taipei (TW)

(72) Inventors: Liu-Yi Huang, New Taipei (TW);
Hsin-Nan Lin, New Taipei (TW)

(73) Assignee: BENQ CORPORATION, Taipei (TW)

( * ) Notice: Subject to any disclaimer, the term of this patent is extended or adjusted under 35 U.S.C. 154(b) by 0 days.

(21) Appl. No.: 15/815,807

(22) Filed: Nov. 17, 2017

(65) Prior Publication Data

US 2018/0146561 A1 May 24, 2018

(30) Foreign Application Priority Data

Nov. 18, 2016 (CN) .......................... 2016 1 1016304

(51) Int. Cl.
*H05K 5/02* (2006.01)
*H05K 5/00* (2006.01)
*H05K 5/03* (2006.01)

(52) U.S. Cl.
CPC ......... *H05K 5/0017* (2013.01); *H05K 5/0086* (2013.01); *H05K 5/0217* (2013.01); *H05K 5/03* (2013.01)

(58) Field of Classification Search
None
See application file for complete search history.

(56) References Cited

U.S. PATENT DOCUMENTS

| | | | | |
|---|---|---|---|---|
| 5,801,919 | A * | 9/1998 | Griencewic | G06F 1/1686 348/552 |
| 6,812,958 | B1 * | 11/2004 | Silvester | G06F 1/1607 348/207.1 |
| 6,930,725 | B1 * | 8/2005 | Hayashi | F16M 11/10 348/207.1 |
| 6,933,981 | B1 * | 8/2005 | Kishida | H04N 1/00249 348/207.1 |
| 7,489,525 | B2 * | 2/2009 | Cheng | G06F 1/1616 361/809 |

(Continued)

FOREIGN PATENT DOCUMENTS

| | | |
|---|---|---|
| CN | 204496339 U | 7/2015 |
| CN | 105163536 A | 12/2015 |

OTHER PUBLICATIONS

Search report of EPO dated Feb. 15, 2018.
Office action of counterpart application by SIPO dated Apr. 27, 2018.

*Primary Examiner* — Xanthia C Cunningham

(57) ABSTRACT

A display device includes a casing and a hanging mechanism. The hanging mechanism is disposed within the casing and includes a covering component and a supporting component. The covering component is detachably disposed on the casing and has a receiving space and an opening. The supporting component is movably disposed within the receiving space and includes a first block portion and a second block portion. The first block portion is movably disposed within the receiving space in a first direction and configured to enter and exit from the receiving space. The first block portion includes a pivoting portion and a stopping portion connected with the pivoting portion. The second block portion is rotatably connected with the pivoting portion about a rotating axis. The first direction, the second direction and the rotating axis are perpendicular to one another.

17 Claims, 8 Drawing Sheets

(56) References Cited

U.S. PATENT DOCUMENTS

| | | | |
|---|---|---|---|
| 7,554,523 B2* | 6/2009 | Chang | G06F 1/1616 345/156 |
| 7,563,040 B2* | 7/2009 | Tsai | G03B 17/02 348/374 |
| 7,596,832 B2* | 10/2009 | Hsieh | E05D 11/06 16/342 |
| 7,652,720 B2* | 1/2010 | Kuo | G06F 1/1616 292/163 |
| 7,894,197 B2* | 2/2011 | Hwang | G01J 1/02 361/752 |
| 7,969,505 B2* | 6/2011 | Saito | G06F 1/1616 348/370 |
| 8,203,646 B2* | 6/2012 | Fan | H04N 5/2252 348/207.1 |
| 8,430,594 B2* | 4/2013 | Liu | H04N 5/2252 348/373 |
| 8,641,301 B2* | 2/2014 | Yang | F16M 11/10 348/207.1 |
| D744,021 S * | 11/2015 | Miyata | D16/202 |
| 9,392,148 B2* | 7/2016 | Kim | G06F 1/1605 |
| 2005/0201047 A1* | 9/2005 | Krah | G06F 1/1616 361/679.55 |
| 2006/0001743 A1* | 1/2006 | Lee | G06F 1/1626 348/207.1 |
| 2008/0012944 A1* | 1/2008 | Lu | H04N 5/2252 348/207.1 |
| 2008/0117581 A1* | 5/2008 | Kuo | G06F 1/1616 361/679.27 |
| 2008/0123314 A1* | 5/2008 | Cheng | G06F 1/1616 361/809 |
| 2008/0143872 A1* | 6/2008 | Lu | H04N 5/2252 348/374 |
| 2009/0231484 A1* | 9/2009 | Lee | G06F 1/1616 348/373 |
| 2010/0020182 A1* | 1/2010 | Wang | G03B 17/00 348/207.1 |
| 2010/0053409 A1 | 3/2010 | Chang | |
| 2011/0050910 A1* | 3/2011 | Fan | H04N 5/2252 348/207.1 |

* cited by examiner

DISPLAY DEVICE

CROSS-REFERENCE TO RELATED APPLICATION

This application claims the benefit of People's Republic of China application Serial No. 201611016304.2, filed on Nov. 18, 2016, the subject matter of which is incorporated herein by reference.

TECHNICAL FIELD

The invention relates in general to a display device, and more particularly to a display device having a hanging function.

BACKGROUND

In order to provide a smooth and beautiful appearance, a casing of a display device is usually smooth and non-chamfered. However, in specific environment, such as eSports market, the display device needs to provide a hanging device for placing the user's headband receiver. There are two types of traditional hanging devices for the display device. One of them is to attach a hook to a lateral surface of the casing by glue. But, when the glue loses adhesion, the hook will fall off to casus. Accordingly, it provides unstable supporting strength. Another type is that the hook is fixed to the lateral surface of the casing by a screw. Although the screw may provide better bonding strength, the structure of the casing is easy to be damaged and the appearance of the display device is contrived.

SUMMARY OF THE DISCLOSURE

According to an embodiment of the disclosure, a display device is provided. The display device has a hanging function and includes a casing and a hanging mechanism. The hanging mechanism is disposed within the casing and includes a first covering component and a supporting component. The first covering component is detachably disposed on the casing and has a receiving space and an opening. The supporting component is movably disposed within the receiving space and includes a first block portion and a second block portion. The first block portion is movably disposed within the receiving space in a first direction and configured to enter and exit from the receiving space. The first block portion includes a pivoting portion and a stopping portion connected with the pivoting portion. The second block portion is rotatably connected with the pivoting portion about a rotating axis. The stopping portion has a stopping surface being staggered with the rotating axis in a second direction, and the first direction, the second direction and the rotating axis are perpendicular to one another.

The above and other aspects of the present disclosure will become better understood with regard to the following detailed description of the preferred but non-limiting embodiment(s). The following description is made with reference to the accompanying drawings.

Figure 1:
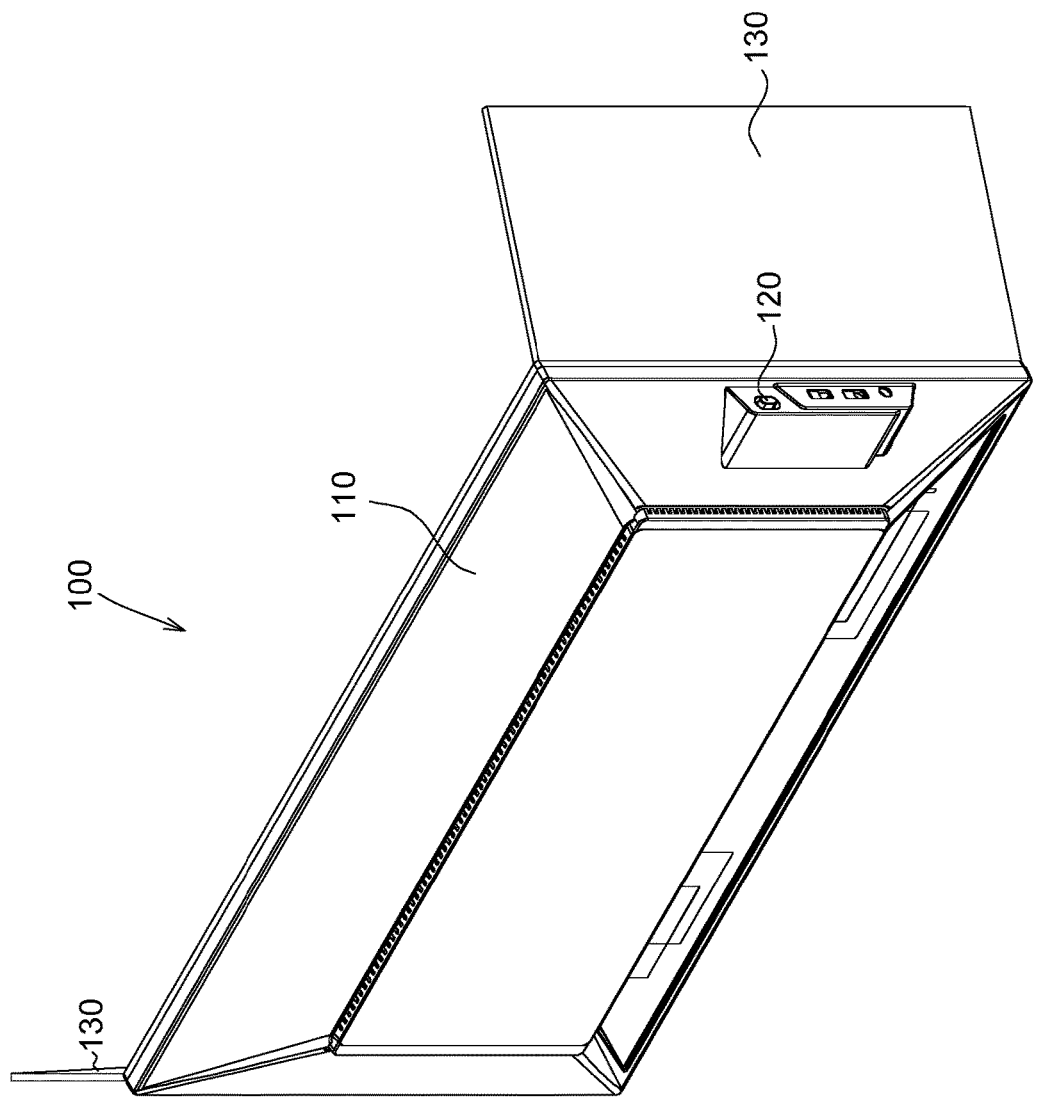
FIG. 1 illustrates a diagram of a hanging mechanism of a display device being in a close state according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF DISCLOSED EMBODIMENTS

Figure 2:
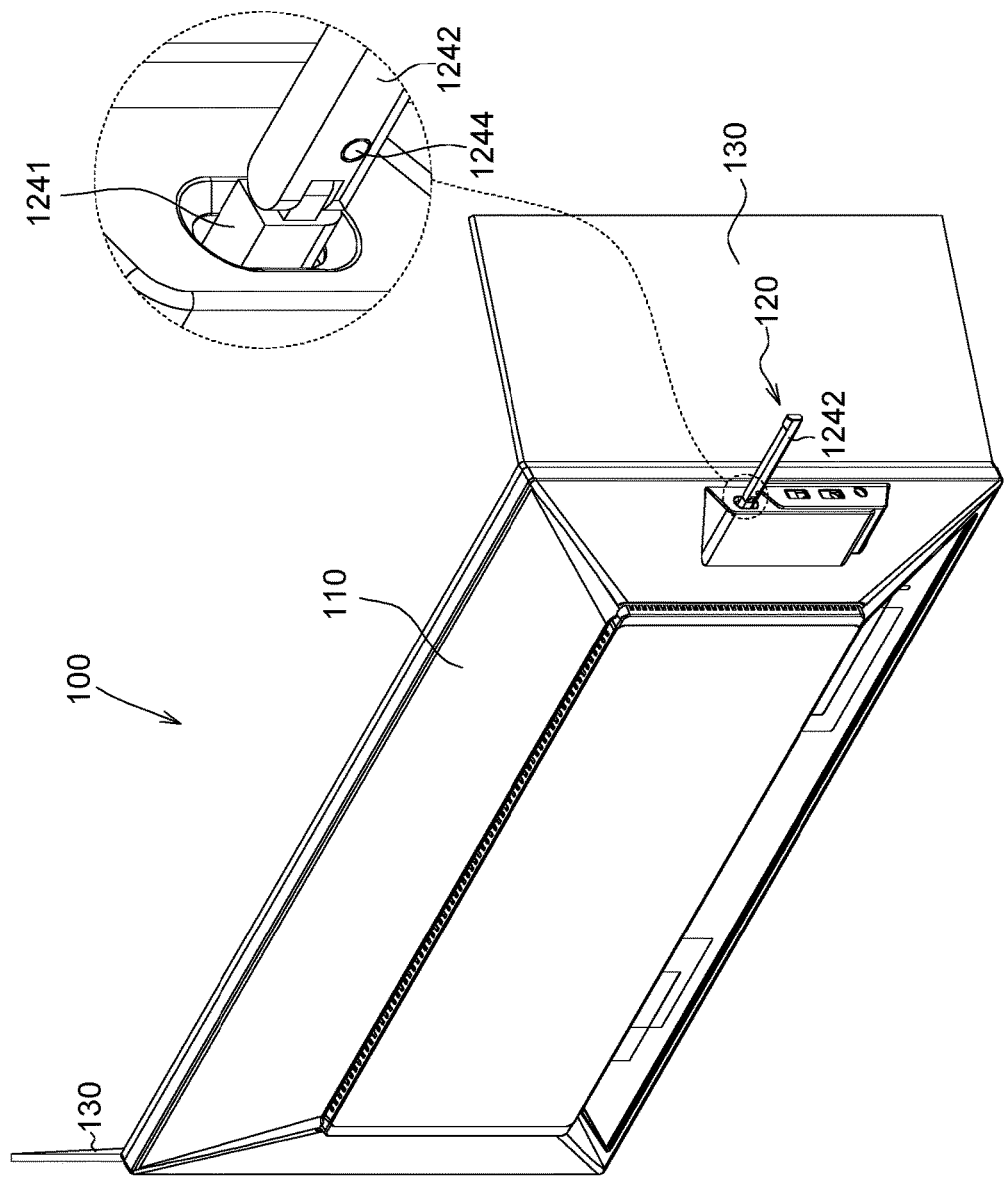
FIG. 2 illustrates a diagram of the hanging mechanism of the display device of FIG. 1 being in an extended state.
Figure 3:
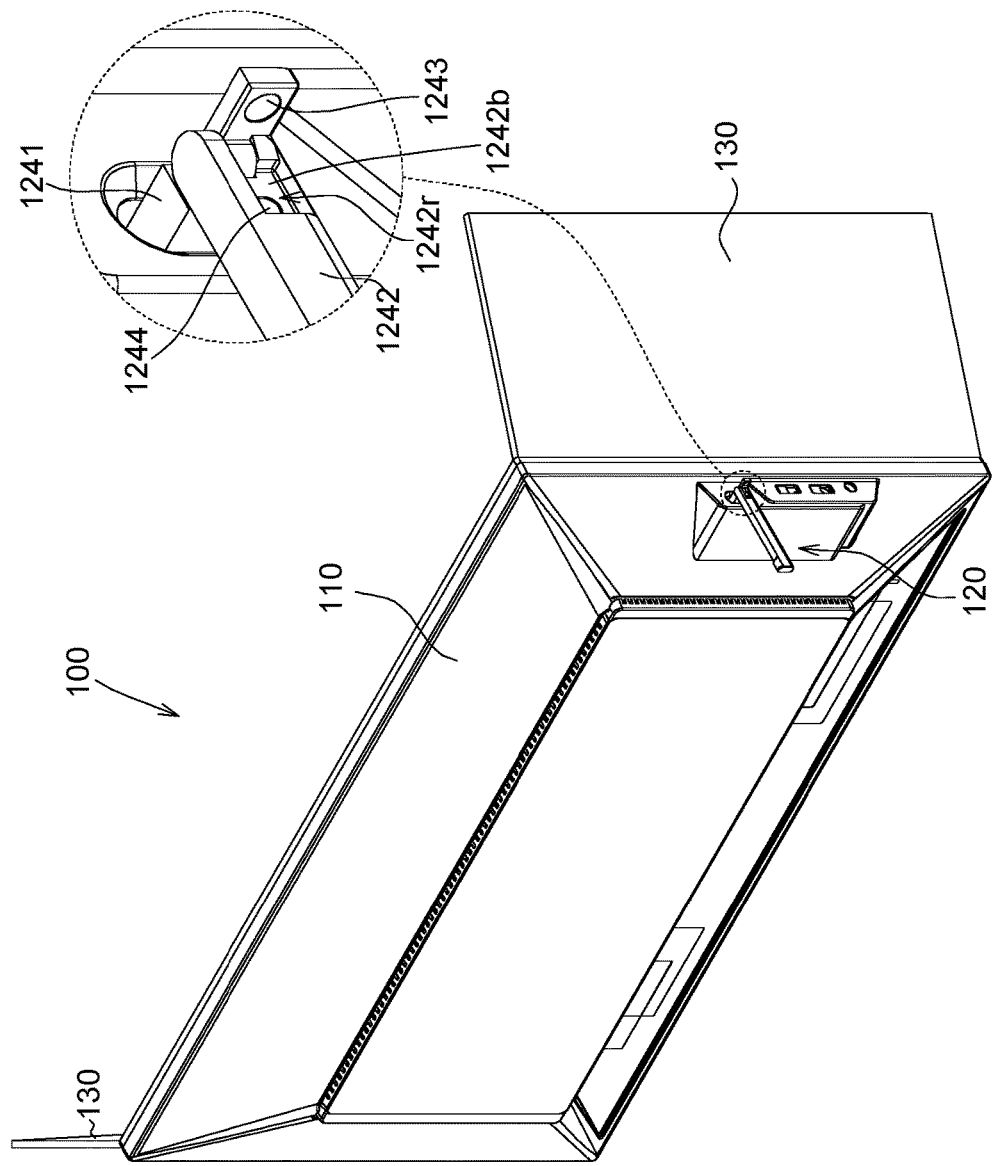
FIG. 3 illustrates a diagram of the hanging mechanism of the display device of FIG. 2 being in a bent state.

Referring to FIGS. 1-3, FIG. 1 illustrates a diagram of a hanging mechanism 120 of a display device 100 being in a close state according to an embodiment of the present invention, FIG. 2 illustrates a diagram of the hanging mechanism 120 of the display device 100 of FIG. 1 being in an extended state, and FIG. 3 illustrates a diagram of the hanging mechanism 120 of the display device 100 of FIG. 2 being in a bent state.

The display device 100 is, for example, a desktop display device, which may be used to display an image from a computer or a television, or the display device 100 itself is the television. However, the display device 100 of the embodiment of the present invention is not limited thereto. The display device 100 and/or the hanging mechanism 120 may also be mounted on other electronic devices, such as home appliances.

As illustrated in FIG. 1, the display device 100 includes a casing 110, a hanging mechanism 120 and two shading plates 130, wherein the two shading plates 130 are pivotally connected at two lateral portions of the casing 110 for preventing lateral light interfering with user. The shading plate 130 is adjacent to the hanging mechanism 120. In another embodiment, the display device 100 may omit the shading plates 130. The hanging mechanism 120 is disposed within the casing 110 and may change to different postures. For example, the hanging mechanism 120 may be retracted inside the casing 110, as illustrated in FIG. 1. The hanging mechanism 120 may also extend out of the casing 110, as illustrated in FIG. 2. As illustrated in FIG. 3, the hanging mechanism 120 may also be changes to the bent state.

The hanging mechanism 120 provides a hanging function for the user to place objects, such as a headband receiver, a key ring, a collar or any other external object. The state of the hanging mechanism 120 of the embodiment of the present invention may be changed to any posture between the extended state of FIG. 2 and the bent state of FIG. 3 to provide various hanging angles. In addition, due to the hanging mechanism 120 of the embodiment of the present invention being allowed to be bent, even if the shading plates 130 are adjacent to the hanging mechanism 120, by adjusting the bent angle of the hanging mechanism 120, the hanging mechanism 120 itself may avoid interfering with the shading plates 130, or the object hanged up on the hanging mechanism 120 may avoid interfering with the shading plates 130.

Figure 4:
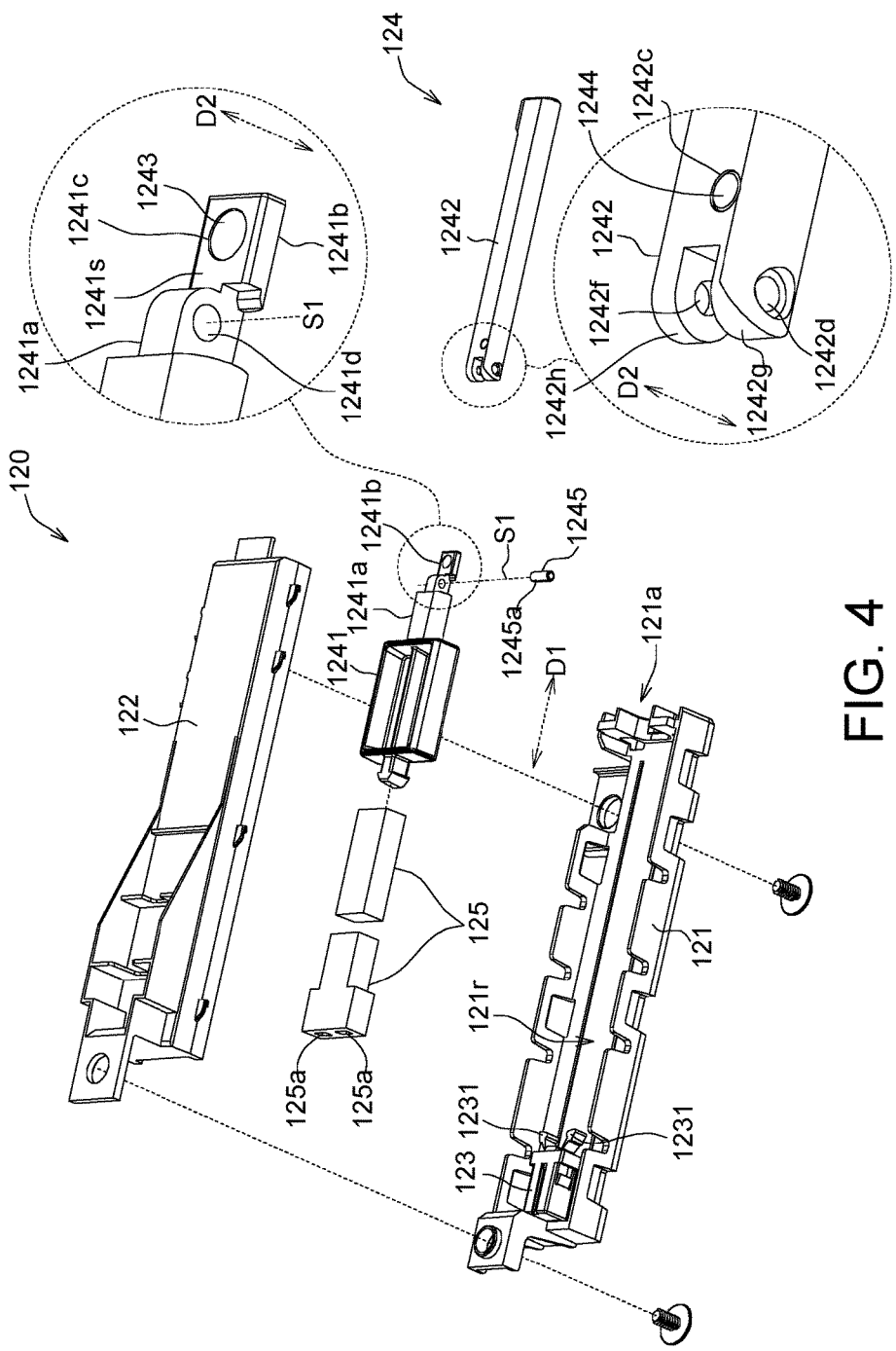
FIG.4 illustrates an exploded view of the hanging mechanism of FIG. 1.

FIG. 4 illustrates an exploded view of the hanging mechanism 120 of FIG. 1. The hanging mechanism 120 includes a first covering component 121, a second covering component 122, a clamping module 123, a supporting component 124 and a connecting component 125.

The first covering component 121 is detachably disposed on the casing 110. The first covering component 121 has a receiving space 121r and an opening 121a. The clamping module 123 is fixedly disposed on the receiving space 121r. The supporting component 124 is movably disposed on the receiving space 121r and is movable relative to the first covering component 121 for changing between a close position (as illustrated in FIG. 1) and an extended position (as illustrated in FIG. 2). The connecting component 125 may connect the clamping module 123 with the supporting component 124, such that the supporting component 124 may apply force to the clamping module 123 through the connecting component 125 to change between the close position and the extended position. In an embodiment, the clamping module 123 may be implemented by a push-push connector. Under this design, the supporting component 124 is pressed once, the supporting component 124 is ejected from the casing 110, as illustrated in FIG. 2. After being pressed again, the supporting component 124 may be received in the casing 110, as illustrated in FIG. 1. As illustrated in FIG. 4, the connecting component 125 has two engaging holes 125a, two elastic arms 1231 of the clamping module 123 may be connected to the connecting component 125 through the two engaging holes 125a. In addition, the connecting component 125 has an engaging hole 125b (illustrated in FIG. 5B), and the hook 124a (illustrated in FIG. 5B) of a first block portion 1241 may be engaged with the engaging hole 125b.

The second covering component 122 may be combined with the first covering component 121 by a screw/screw hole or an engaging structure to cover the clamping module 123, the supporting component 124 and the connecting component 125, and accordingly it may prevent the clamping module 123, the supporting component 124 and the connecting component 125 from dropping. The bonding mechanism between the first covering component 121 and the second covering component 122 is not limited to the above embodiment, and it may be changed according to practical requirements.

The supporting component 124 includes the first block portion 1241, a second block portion 1242, a first fixing portion 1243 and a second fixing portion 1244. The first block portion 1241 is movably disposed on the receiving space 121r in a first direction D1 and enters the receiving space 121r through the opening 121a. The first block portion 1241 includes a pivoting portion 1241a and a stopping portion 1241b connected with the pivoting portion 1241a.

The second block portion 1242 is pivotally connected to the pivoting portion 1241a and is rotatable about a rotating axis S1. The rotating angle of the second block portion 1242 may be limited by the stopping portion 1241b. For example, the stopping portion 1241b has a stopping surface 1241s, and the stopping surface 1241s is staggered with the rotating shaft S1 along a second direction D2. The second direction D2, the first direction D1, and the rotating shaft S1 are perpendicular to one another. The stopping surface 1241s may stop a first lateral surface 1242b (illustrated in FIG. 3) of the second block portion 1242 to prevent the second block portion 1242 from rotating. As illustrated in FIG. 2, since the stopping surface 1241s stops the first lateral surface 1242b from keeping rotating, the second block portion 1242 may be stopped from rotating toward the shading plate 130, such that the second block portion 1242 may be prevented from interfering with the shading plate 130. In an embodiment, when the stopping surface 1241s stops the first lateral surface 1242b, the first block portion 1241 and the second block portion 1242 are substantially located at a straight line. However, as long as depth of the recess 1242r (or position of the first lateral surface 1242b) and/or distance between the stopping surface 1241s and the rotating axis S1 in the second direction D2 is adjusted, the angle between the first block portion 1241 and the second block portion 1242 may be changed when the stopping surface 1241s stops the first lateral surface 1242b.

As illustrated in FIGS. 3 and 4, the second block portion 1242 has a recess 1242r. The first lateral surface 1242b is a recess bottom surface of the recess 1242r. When the first block portion 1241 and the second block portion 1242 are in the extended state, as illustrated in FIG. 2, the stopping portion 1241b of the first block portion 1241 may be located in the recess 1242r.

As illustrated in FIG. 4, the first fixing portion 1243 is disposed on the stopping portion 1241b, and the second fixing portion 1244 is disposed on the second block portion 1242. When the first block portion 1241 and the second block portion 1242 are in the extended state (as illustrated in FIG. 2), the first fixing portion 1243 and the second fixing portion 1244 are fixed to each other for fixing a relative position between the first block portion 1241 and the second block portion 1242. In the present embodiment, the first fixing portion 1243 and the second fixing portion 1244 are, for example, magnetic elements, such as magnets, so that the first fixing portion 1243 and the second fixing portion 1244 are magnetically attracted to each other.

As illustrated in FIG. 4, the stopping portion 1241b has a first receiving hole 1241c, and the second block portion 1242 has a second receiving hole 1242c. The first fixing portion 1243 is disposed on the first receiving hole 1241c, and the second fixing portion 1244 is disposed in the second receiving hole 1242c. When the first block portion 1241 and the second block portion 1242 are in the extended state, the first receiving hole 1241c corresponds to the second receiving hole 1242c in position, such that the first fixing portion 1243 and the second fixing portion 1244 disposed therein may approach and attract to each other. In addition, the first receiving hole 1241c and the second receiving hole 1242c may be through holes or blind holes. However, one may be a through hole, and the other may be a blind hole. As long as the first fixing portion 1243 and the second fixing portion 1244 may be fixed to each other, the embodiment of the present invention does not limit the forms of the first receiving opening 1241c and the second receiving opening 1242c.

As illustrated in FIG. 4, the first block portion 1241 has a first opening 1241d, and the second block portion 1242 has a second opening 1242d and a third opening 1242f. The supporting component 124 further includes a pivoting component 1245. The pivoting component 1245 is disposed on the first opening 1241d, the second opening 1242d and the third opening 1242f to connect the first block portion 1241 with the second block portion 1242 for preventing the first block portion 1241 from being detached from the second block portion 1242. In an embodiment, the first opening 1241d and the second opening 1242d are through holes, and the third opening 1242f is a blind hole or a through hole, so that the pivoting component 1245 may enter the third opening 1242f through the first opening 1241d and the second opening 1242d in order. In addition, the pivoting component 1245 is loose-fit with the first opening 1241d and the second opening 1242d, such that the first block portion 1241 and the second block portion 1242 are rotatable relative to the pivoting component 1245. One terminal portion 1245a of the pivoting component 1245 is interference-fit with the third opening 1242f, such that one terminal portion 1245a of the pivoting component 1245 is fixed to the third opening 1242f of the second block portion 1242 so as to prevent the second block portion 1242 from being detached from the pivoting component 1245.

As illustrated in FIG. 4, the second block portion 1242 includes a first protrusion 1242g and a second protrusion 1242h. The second opening 1242d passes through the first protrusion 1242g. The third opening 1242f is opened in the second protrusion 1242h, and the pivoting portion 1241a is located in space between the first protrusion 1242g and the second protrusion 1242h so as to be restricted by the first protrusion 1242g and the second protrusion 1242h. As a result, it may prevent the pivoting portion 1241a from being detached from the second block portion 1242.

Figure 5A:
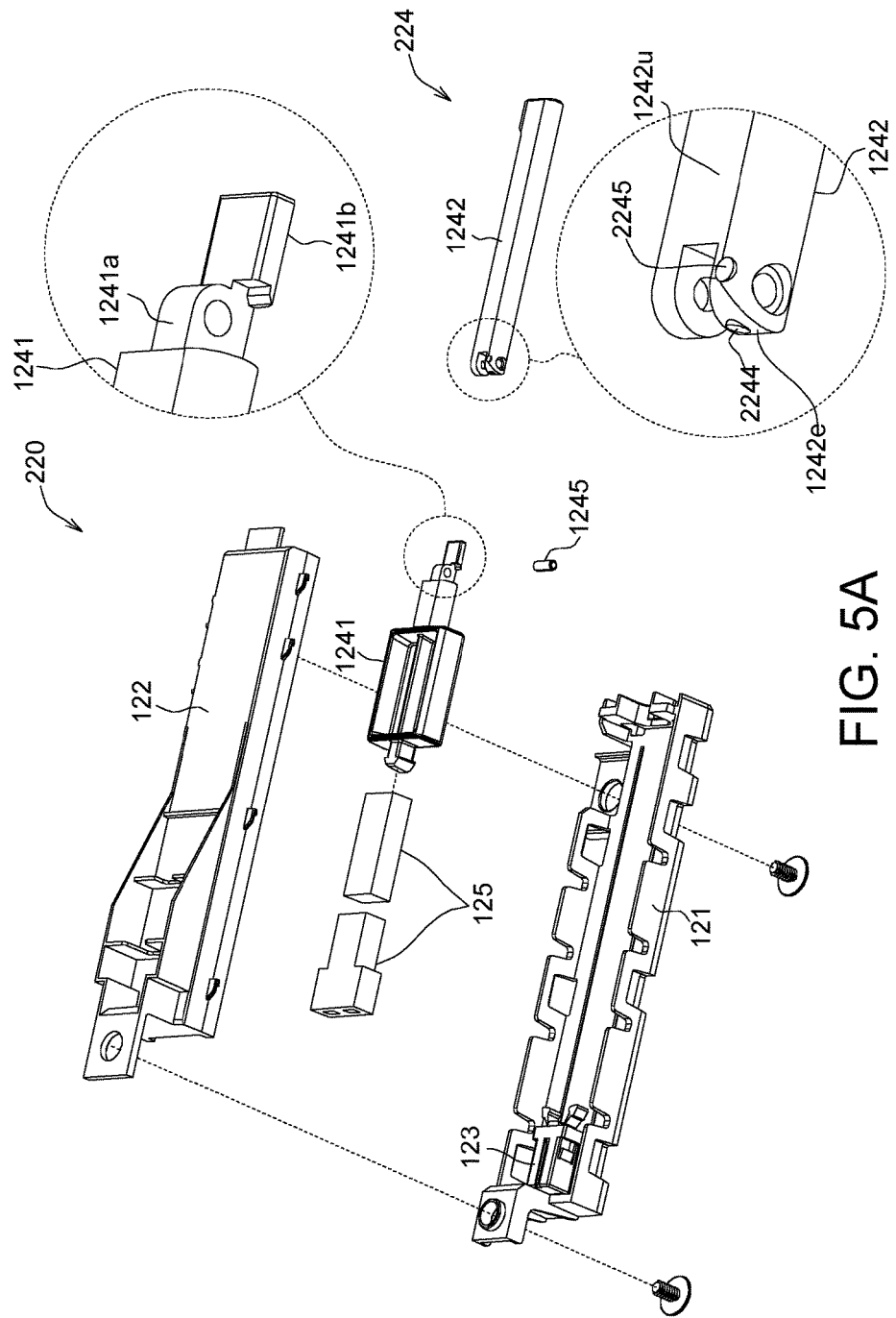
FIGS. 5A and 5B illustrate an exploded view of a hanging mechanism according to another embodiment of the present invention.
Figure 5B:
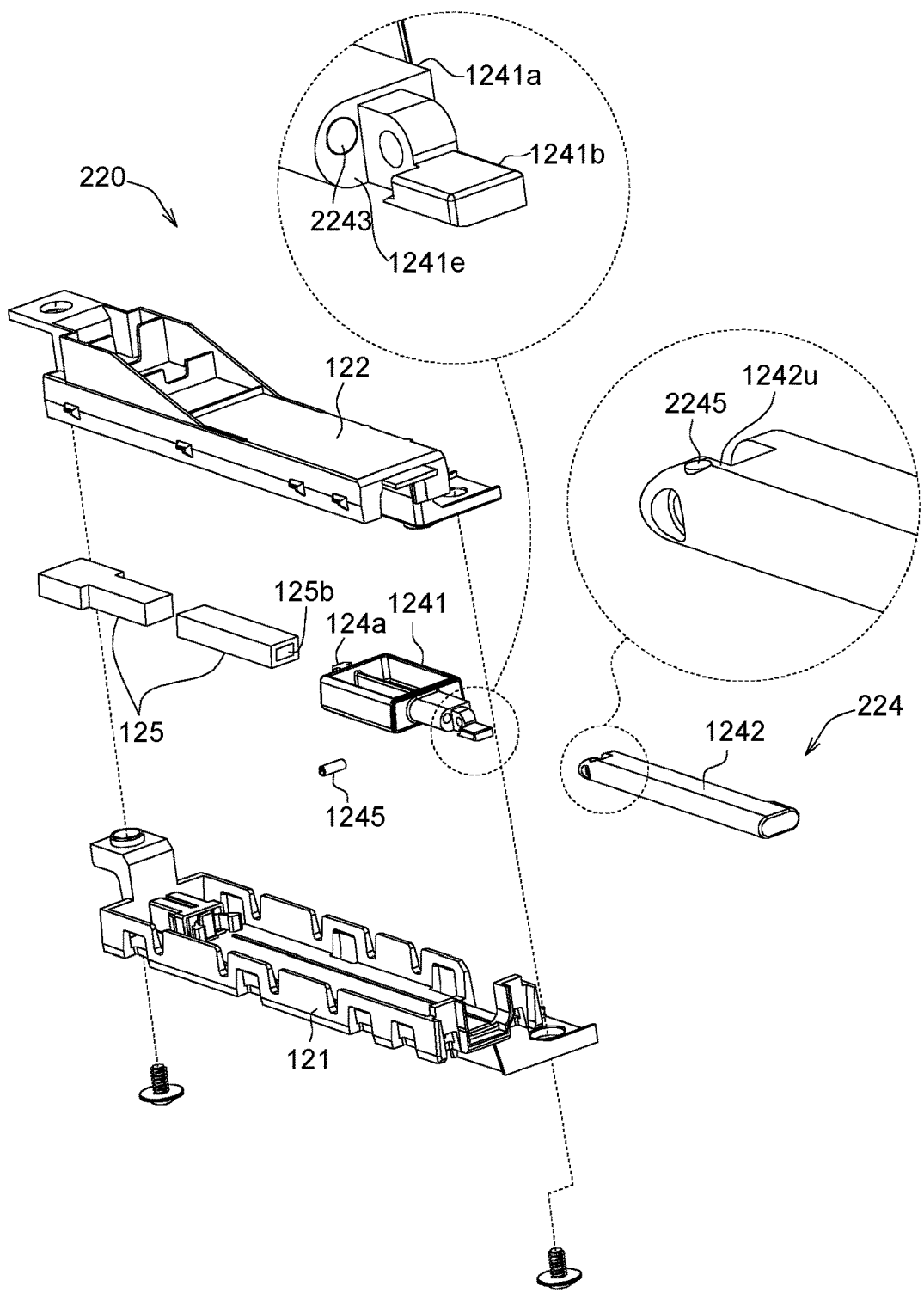

Referring to FIGS. 5A and 5B, which illustrate an exploded view of a hanging mechanism 220 according to another embodiment of the present invention.

As illustrated in FIGS. 5A and 5B, the hanging mechanism 220 includes the first covering component 121, the second covering component 122, the clamping module 123, a supporting component 224 and the connecting component 125. It is different from the aforementioned hanging mechanism 120, the supporting component 224 of the hanging mechanism 220 of the present embodiment includes a first fixing portion 2243 and a second fixing portion 2244, wherein the first fixing portion 2243 is disposed on a first terminal surface 1241e of the pivoting portion 1241a, and the second fixing portion 2244 is disposed on a second terminal surface 1242e of the second block portion 1242. When the first block portion 1241 and the second block portion 1242 are in the extended state (as illustrated in FIG. 2), the first fixing portion 2243 faces the second fixing portion 2244, such that first fixing portion 2243 and the second fixing portions 2244 are fixed to each other so as to fix the relative position of the first block portion 1241 and the second block portion 1242. In the present embodiment, the first fixing portion 2243 and the second fixing portion 2244 are, for example, magnetic elements, such as magnets.

In addition, as illustrated in FIGS. 5A and 5B, the supporting component 224 further includes a third fixing portion 2245. The third fixing portion 2245 is disposed on a second lateral surface 1242u of the second block portion 1242. When the first block portion 1241 and the second block portion 1242 are in the bent state (as illustrated in FIG. 3), the first fixing portion 2243 and the third fixing portion 2245 face each other, such that the first fixing portion 2243 and the third fixing portion 2245 are fixed to each other so as to fix the relative position of the first block portion 1241 and the second block portion 1242. In the present embodiment, the third fixing portion 2245 is, for example, a magnetic element, such as a magnet.

In an embodiment, the first fixing portion 2243 is, for example, one of a protrusion and an indentation, and each of the second fixing portion 2244 and the third fixing portion 2245 is, for example, the other of the protrusion and the indentation, wherein the protrusion and the indentation are interference-fit or transition-fit. In this design, when the first block portion 1241 and the second block portion 1242 are in the extended state (as illustrated in FIG. 2), the first fixing portion 2243 is engaged with the second fixing portion 2244 to fix the relative position between the first block portion 1241 and the second block portion 1242. When the first block portion 1241 and the second block portion 1242 are in the bent state (as illustrated in FIG. 3), the first fixing portion 2243 is engaged with the third fixing portion 2245 to fix the relative position between the first block portion 1241 and the second block portion 1242.

In another embodiment, the supporting component 224 may further include the first fixing portion 1243 and the second fixing portion 1244 of the supporting component 124, so as to enhance the stability of the supporting component 224 in the extended state.

Figure 6A:
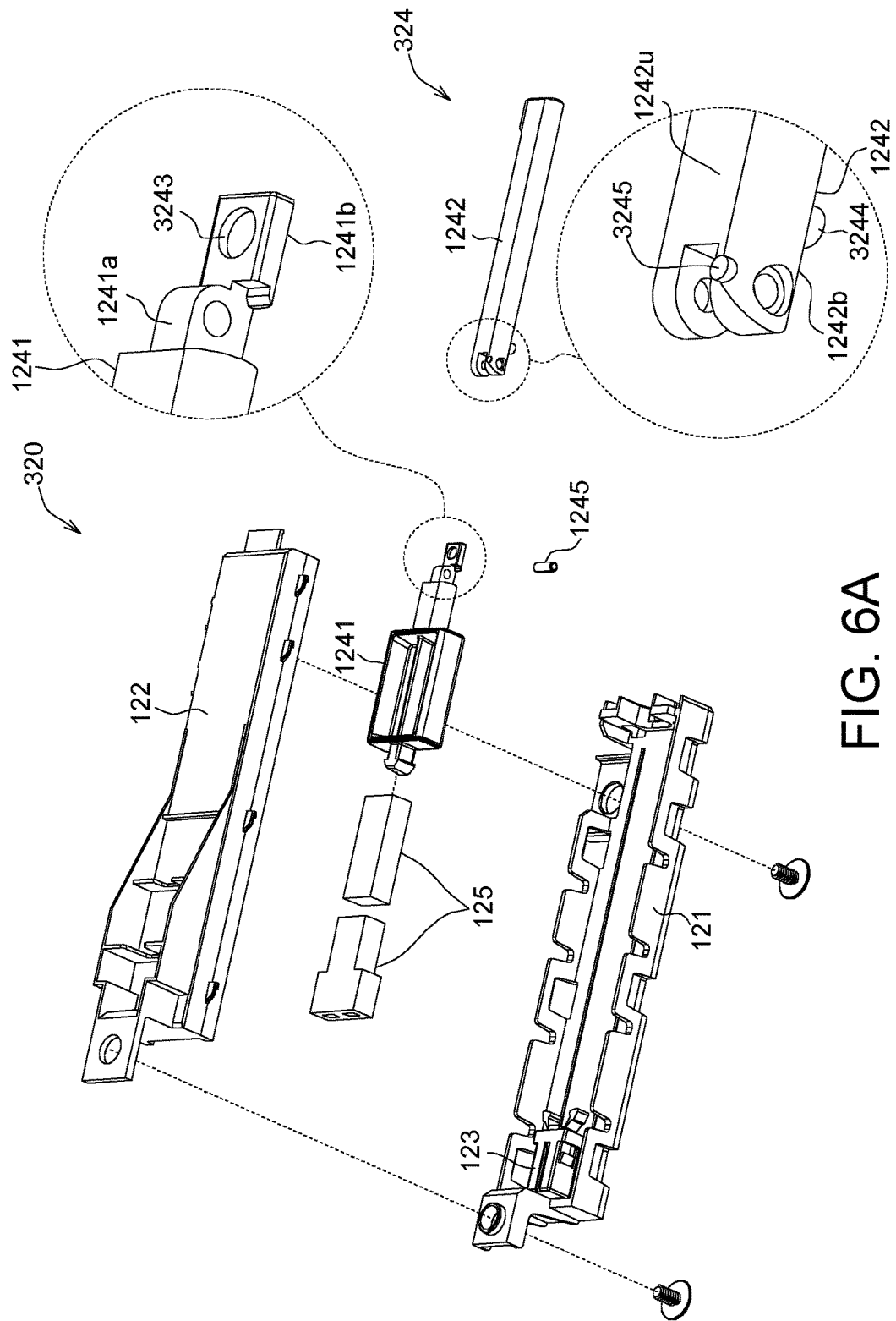
FIGS. 6A and 6B illustrate an exploded view of the hanging mechanism according to another embodiment of the present invention.
Figure 6B:
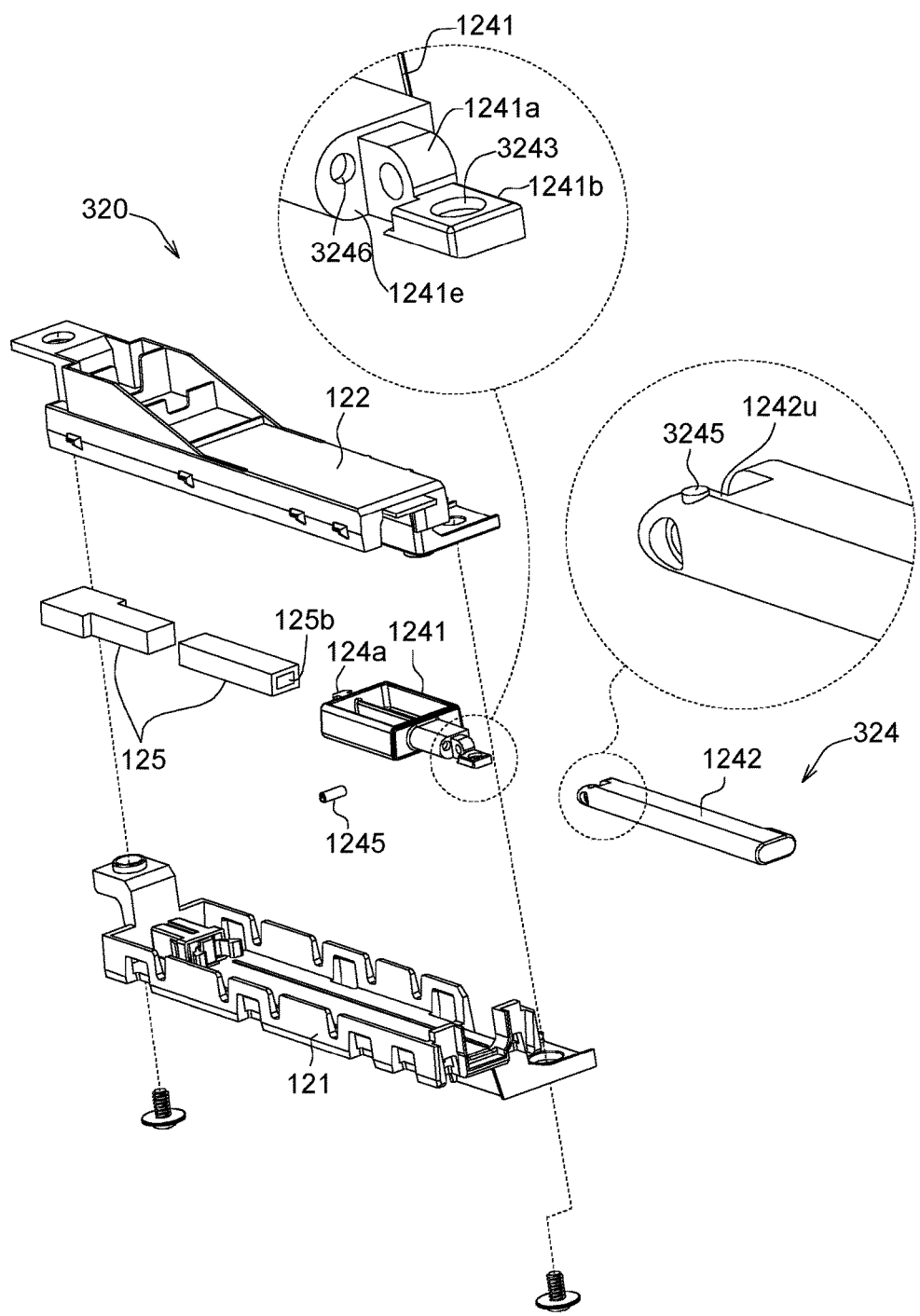

Referring to FIGS. 6A and 6B, which illustrate an exploded view of the hanging mechanism 320 according to another embodiment of the present invention.

As illustrated in FIG. 6A, the hanging mechanism 320 includes the first covering component 121, the second covering component 122, the clamping module 123, a supporting component 324 and the connecting component 125. It is different from the aforementioned hanging mechanism 120, the supporting component 324 of the hanging mechanism 320 of the present embodiment includes a first fixing portion 3243 and a second fixing portion 3244, wherein the first fixing portion 3243 is disposed on the stopping portion 1241b, and the second fixing portion 3244 is disposed on the first lateral surface 1242b (illustrated in FIG. 3) of the second block portion 1242. When the first block portion 1241 and the second block portion 1242 are in the extended state (as illustrated in FIG. 2), the first fixing portion 3243 and the second fixing portion 3244 are fixed to each other to fix the relative position of the first block portion 1241 and the second block portion 1242. In the present embodiment, one of the first fixing portion 3243 and the second fixing portion 3244 is, for example, the protrusion, and the other of the first fixing portion 3243 and the second fixing portion 3244 is, for example, the indentation. The protrusion and the indentation are interference-fit or transition-fit, such that the protrusion and the indentation may be engaged with each other when connected to each other.

In addition, the supporting component 324 further includes a third fixing portion 3245 disposed on the second lateral surface 1242u of the second block portion 1242, and a fourth fixing portion 3246 disposed on the first terminal surface 1241e of the pivoting portion 1241a of the first block portion 1241. When the first block portion 1241 and the second block portion 1242 are in the bent state (as illustrated in FIG. 3), the third fixing portion 3245 and the fourth fixing portion 3246 are engaged with each other to fix the relative position between the first block portion 1241 and the second block portion 1242. In the present embodiment, one of the third fixing portion 3245 and the fourth fixing portion 3246 is, for example, the protrusion, and the other of the third fixing portion 3245 and the fourth fixing portion 3246 is, for example, the indentation. The protrusion and the indentation are interference-fit or transition-fit, such that the protrusion and the indentation may engage with each other when connected to each other.

It will be apparent to those skilled in the art that various modifications and variations can be made to the structure of the disclosed embodiments without departing from the scope or spirit of the disclosure. In view of the foregoing, it is intended that the disclosure cover modifications and variations of the present disclosure provided they fall within the scope of the following claims and their equivalents.

What is claimed is:
1. A display device having a hanging function, comprising:
a casing;

a hanging mechanism disposed within the casing and comprising:
  a first covering component detachably disposed on the casing and having a receiving space and an opening;
  a supporting component movably disposed within the receiving space and comprising:
    a first block portion movably disposed within the receiving space in a first direction and configured to enter and exit from the receiving space through the opening, wherein the first block portion comprises a pivoting portion and a stopping portion connected with the pivoting portion; and
    a second block portion rotatably connected with the pivoting portion about a rotating axis;
  wherein the stopping portion has a stopping surface being staggered with the rotating axis in a second direction, and the first direction, the second direction and the rotating axis are perpendicular to one another.

2. The display device according to claim 1, wherein the supporting component further comprises:
  a first fixing portion disposed on the stopping portion; and
  a second fixing portion disposed on the second block portion;
  wherein the fixing portion and the second fixing portion are fixed to each other when the first block portion and the second block portion are in an extended state.

3. The display device according to claim 1, wherein the supporting component further comprises:
  a first fixing portion disposed on a first terminal surface of the pivoting portion; and
  a second fixing portion disposed on a second terminal surface of the second block portion;
  wherein the fixing portion and the second fixing portion are fixed to each other when the first block portion and the second block portion are in an extended state.

4. The display device according to claim 2, wherein the first fixing portion and the second fixing portion are magnetic components.

5. The display device according to claim 3, wherein the first fixing portion and the second fixing portion are magnetic components.

6. The display device according to claim 2, wherein one of the first fixing portion and the second fixing portion is a protrusion, and the other of the first fixing portion and the second fixing portion is an indentation.

7. The display device according to claim 3, wherein one of the first fixing portion and the second fixing portion is a protrusion, and the other of the first fixing portion and the second fixing portion is an indentation.

8. The display device according to claim 1, wherein the second block portion has a recess for receiving the stopping portion, and the recess has a first lateral surface stopped by the stopping surface.

9. The display device according to claim 3, wherein the supporting portion further comprises:
  a third fixing portion disposed on a second lateral surface of the second block portion;
  wherein the fixing portion and the third fixing portion are fixed to each other when the first block portion and the second block portion are at in extended state.

10. The display device according to claim 9, wherein the first fixing portion, the second fixing portion and the third fixing portion are magnetic components.

11. The display device according to claim 9, wherein the first fixing portion is one of a protrusion and an indentation, and each of the second fixing portion and the third fixing portion is the other of the protrusion and the indentation.

12. The display device according to claim 2, wherein the stopping portion has a first receiving opening, the second block portion has a second receiving opening, the first fixing portion is disposed on the first receiving opening, and the second fixing portion is disposed on the second receiving opening; when the first block portion and the second block portion are at an extended state, the first receiving opening and the second receiving opening overlap.

13. The display device according to claim 12, wherein the first receiving opening is blind hole, and the second receiving opening is through hole.

14. The display device according to claim 1, wherein the first block portion has a first opening, and the second block portion has a second opening and a third opening; the supporting component further comprises:
  a pivoting component disposed on the first opening, the second opening and the third opening.

15. The display device according to claim 14, wherein the first opening and the second opening are through holes, the pivoting component is loose-fit with the first opening and the second opening, and one terminal portion of the pivoting component is interference-fit with the third opening.

16. The display device according to claim 15, wherein the third opening is a blind hole.

17. The display device according to claim 14, wherein the second block portion comprises a first protrusion and a second protrusion opposite to the first protrusion, the second opening passes through the first protrusion, the third opening is opened in the second protrusion, and the pivoting portion is located between the first protrusion and the second protrusion.

* * * * *